United States Patent [19]
Sher

[11] Patent Number: 6,009,029
[45] Date of Patent: Dec. 28, 1999

[54] CIRCUIT AND METHOD FOR ANTIFUSE STRESS TEST

[75] Inventor: Joseph C. Sher, Boise, Id.

[73] Assignee: Micron Technology, Inc., Boise, Id.

[21] Appl. No.: 09/201,204

[22] Filed: Nov. 30, 1998

Related U.S. Application Data

[63] Continuation of application No. 08/892,605, Jul. 14, 1997, Pat. No. 5,848,010.

[51] Int. Cl.$^6$ .................................................. G11C 13/00
[52] U.S. Cl. ...................................... 365/201; 365/189.01
[58] Field of Search .............................. 365/201, 890.01, 365/189.03, 230.01

[56] References Cited

U.S. PATENT DOCUMENTS

| | | | |
|---|---|---|---|
| 5,155,704 | 10/1992 | Walther et al. .......................... | 365/201 |
| 5,351,213 | 9/1994 | Nakashima ............................... | 365/201 |
| 5,408,435 | 4/1995 | McClure et al. ......................... | 365/201 |

*Primary Examiner*—Terrell W. Fears
*Attorney, Agent, or Firm*—Schwegman, Lundberg Woessner & Kluth P.A.

[57] ABSTRACT

A test circuit for stress testing antifuses before programming. The test circuit provides a voltage to an antifuse detection circuit during antifuse stress testing. In one embodiment, the provided voltage is externally received at a probe pad. In another embodiment, the test circuit controls a voltage generating circuit output voltage from a normal operating voltage to a stress voltage, such as by shifting the ground reference for the voltage generating circuit. The stress voltage can be varied as needed for a particular test setup and/or for different batches of antifuse circuits. Since the stress voltage is independent of the power supply voltage VCC, antifuse stressing can be concurrent with other prefuse tests, obviating the need for a dedicated antifuse stress test and reducing test time.

30 Claims, 3 Drawing Sheets

CIRCUIT AND METHOD FOR ANTIFUSE STRESS TEST

This application is a continuation of U.S. Ser. No. 08/892,605, filed on Jul. 14, 1997, U.S. Pat. No. 5,848,010.

FIELD OF THE INVENTION

The present invention relates to programmable logic devices, such as antifuses, and more particularly, to a test circuit and method for self-stressing antifuses prior to their programming.

BACKGROUND OF THE INVENTION

Programmable logic devices, such as antifuses, are commonly used for changing the connectivity of an integrated circuit after fabrication. For example, one application of antifuses is in the repair of integrated circuit memory devices, such as random access memory (RAM) devices. Memory devices are often fabricated with several redundant elements (rows or columns) of memory cells that can be substituted for similar elements that are found to be defective. Antifuses can be selectively programmed to reroute the addresses of failing elements (rows or columns) such that functional redundant elements are addressed instead.

As fabricated in its unblown condition, the antifuse functions as a capacitor and presents a very high resistance, e.g., 10 Megaohms, between its terminals. The antifuse is programmed by shorting its terminals together, providing a relatively low resistance path of approximately between 200 ohms and 10 kiloohms. The programming is carried out by applying, across the terminals of the antifuse, a programming voltage of sufficient amplitude to cause breakdown of the dielectric interposed between its terminals.

Integrated circuit memory devices undergo extensive testing during manufacturing. Antifuses included in such memory devices are also tested prior to programming the antifuses. Antifuses are tested for failure mechanisms including defects in the dielectric between its terminals, defects in the contacts to the antifuse terminals, and other antifuse fault conditions. It is often desirable to provide an antifuse stress test, in which a voltage magnitude greater than an operating voltage, but less than a programming voltage is applied across the terminals of an antifuse to identify weak or defective antifuses, such as may result from dielectric defects, for example. The antifuse stress test is needed prior to actual programming of the antifuses. Since antifuse stress testing requires a different stress voltage than used during testing of the RAM memory cells, a separate testing operation is required to accomplish stress testing of antifuses.

Testing the RAM memory cells involves placing the integrated circuit memory device in a test mode, as distinguished from its normal operating mode, such as by applying a test function voltage, commonly referred to as a "supervoltage", to one of the external pins of the integrated circuit device. In one example, the supervoltage is 4.5 volts higher than a chip power supply voltage VCC. The integrated circuit memory device includes a circuit that detects the supervoltage and generates a test enable signal, which is applied to test circuits of the device for initiating various test procedures as is known in the art.

FIG. 1, which is labeled "Prior Art", illustrates one known stress test circuit that is used in antifuse test procedures for applying an antifuse stress voltage. During normal operation, the test circuit couples a voltage DVC2E produced at node 120 by a voltage generating circuit 102 to an output node 104 which is connected to a terminal 204 of a conventional antifuse detection circuit, shown in FIG. 2, which is labeled "Prior Art". During normal operation, the antifuse detection circuit is used to indicate whether the antifuse 202 is in an "unblown" or "blown" condition. During a test mode of operation, the test circuit decouples the voltage generating circuit 102 from the output node 104 and couples the output of a tristateable driver 106 to the output node 104 for applying to output node 104 a stress voltage that is derived from the power supply voltage VCC.

Voltage generating circuit 102 includes p-channel transistors 108 and diode-connected, n-channel transistors 110. The test circuit includes a gating circuit 112, embodied as a multiplexer, an enabling circuit 114, including a NOR gate 116 and an inverter 118, and the tri-stateable driver 106. The enabling circuit 114 determines the state of the multiplexer 112 based upon the logic state of test signal SUPERVOLT that is applied to an input of NOR gate 116.

During normal memory device operation, test signal SUPERVOLT is at a logic low level, and the output at node 120 of the voltage generating circuit 102 is coupled to the test circuit output at node 104 through the multiplexer 112. When test signal SUPERVOLT is at a logic high level, the multiplexer 112 is disabled, decoupling the voltage generating circuit 102 from the test circuit output at node 104. Tri-stateable driver 106 has inputs connected to receive the complementary state inputs provided at the output 122 of the NOR gate 116 and the output 124 of inverter 118, respectively, for controlling its operation. Tri-stateable driver 106 also receives an antifuse stress enable signal AF_STRESS. When stress enable signal AF_STRESS and test signal SUPERVOLT are both at a logic low level, tristateable driver 106 is disabled, providing a high impedance level to the output node 104. When the stress enable signal AF_STRESS and test signal SUPERVOLT each become a logic high level, the tri-stateable driver 106 applies a voltage corresponding to the power supply voltage VCC to the output node 104. Output node 104 is connected to a node 204 of the detection circuit which, in turn, is connected to a control terminal of a pass gate, e.g. the gate of an n-channel transistor 206 (FIG. 2) of the antifuse detection circuit.

In FIG. 2, one terminal of the antifuse 202 is connected to the power supply voltage VCC through series-connected p-channel transistors 208, 210 and n-channel transistors 206, 212. The gate terminal of n-channel transistor 212 is coupled to the supervoltage Vccp!, which is typically more positive than the positive supply voltage VCC, as described above. The other terminal of the antifuse is connected to ground through series-connected n-channel transistors 214 and 216. Transistor 206 functions as a pass gate that is controlled by the voltage DVC2E. Transistor 206 limits the voltage at node 207 to antifuse 202 to a level corresponding to $DVC2E-V_T$, which is less than the power supply voltage VCC, where $V_T$ is the threshold voltage drop of the pass gate transistor 206.

Referring again to FIG. 1, during the antifuse testing procedure, a test signal "SUPERVOLT" disables multiplexer 112, decoupling voltage generating circuit 102 from output node 104. When the antifuse stress enable signal AF_STRESS is also provided, tri-stateable driver 106 applies a voltage corresponding to the power supply voltage VCC to the output node 104 for application to the pass gate 206 (FIG. 2). Thus, the voltage that is applied to the control input of pass gate 206 during the antifuse stress test is the power supply voltage VCC. However, stress voltage levels that are different from the levels of power supply voltage VCC (e.g., approximately between 2.5 volts and 8 volts, may be desired during the antifuse stress testing. This is difficult to obtain because the power supply voltage level VCC is established by application of a common external power supply voltage. Moreover, the levels of the supply voltage VCC are not optimum for antifuse stress testing. As a result, a dedicated test is required for antifuse stress testing, i.e. separate from other tests of RAM memory cells. This increases test time, and correspondingly increases manufacturing costs.

For the reasons stated above, and for other reasons stated below which will become apparent to those skilled in the art upon reading and understanding the present specification, there is a need in the art for a test circuit and method for stressing antifuses prior to programming the antifuses, which is independent of the level of the chip supply voltage. There is a further need in the art for such a test circuit and method which eliminates the need for a dedicated test time for antifuse stress testing such that antifuses can be stressed while other circuits on the integated circuit die are undergoing normal testing.

SUMMARY OF THE INVENTION

The present invention describes a test circuit and method of its use for stress testing a test element, including testing a programmable element such as an antifuse. In one embodiment, the test circuit provides a voltage to the test element. In a normal mode of operation, a normal operating voltage is provided to the test element. In a stress test mode of operation, a stress voltage is applied to the test element.

In one embodiment, the test circuit includes an output node coupled to the test element. A first gating circuit couples the output of a voltage source to the output node. A second gating circuit couples a stress voltage received from an external pad to the output node in response to a stress voltage enable signal.

In another embodiment, the test circuit includes an output node coupled to the test element. A voltage generating circuit provides an output voltage to the output node. A control circuit adjusts the output voltage from the operating voltage level to the stress voltage level in response to a stress voltage enable signal.

The coupling of the output node to the test element is, in one embodiment, through a transistor. The gate terminal of the transistor is coupled to the output node and a source/drain terminal of the transistor is coupled to the test element, such as an antifuse. Thus, the stress voltage is applied to the antifuse through the control input of a pass gate for regulating the voltage that is applied to the antifuse by an antifuse detection circuit.

The present invention describes a semiconductor memory device. In one embodiment, the memory device includes a memory array having a plurality of addressable memory cells. An addressing circuit is provided for accessing the memory cells. A plurality of programmable elements, such as antifuses, are associated with the addressing circuit. A detection circuit is provided for detecting the condition of the element. A test circuit is included for stress testing the element. The test circuit includes an output node coupled to a pass gate in the antifuse detection circuit A voltage generating circuit coupled to the element. A voltage generating circuit provides an output voltage to the output node. A control circuit controls the output voltage at the output node between an operating voltage and a stress voltage, based upon a stress voltage enable signal.

The present invention also describes a method for stress testing an antifuse. An output node, which is coupled to a test element such as an antifuse, is decoupled from a voltage generating circuit. The output node is coupled to a probe pad, and a stress voltage is applied to the pad. In one embodiment, the stress voltage is adjusted to regulate, through a control gate of a transistor, the magnitude of the voltage that is applied to the test element.

In another embodiment, the test circuit output node is coupled to the test element. An output node of a voltage generating circuit is coupled to the output node of the test circuit. The voltage generating circuit output node voltage is adjusted from an operating voltage level to a stress voltage level. The stress voltage is applied to the output node for adjusting a voltage that is applied to the test element. In one embodiment, the stress voltage is adjusted to regulate, through a control gate of a transistor, the magnitude of a voltage applied to the test element.

Thus, the test circuit of the present invention provides an antifuse stress voltage that is independent of the power supply voltage VCC, allowing antifuse stress testing simultaneous with other pre-fuse tests prior to programming the antifuses. Moreover, the magnitude of the stress voltage can be adjusted to compensate for variations in device or process conditions. Consequently, the present invention minimizes the time required for testing the antifuses because the stress test is concurrent with other tests, thereby reducing test time and manufacturing costs.

BRIEF DESCRIPTION OF THE DRAWINGS

In the drawings, like numerals describe substantially similar components throughout the several views.

DESCRIPTION OF THE PREFERRED EMBODIMENTS

Figure 1:
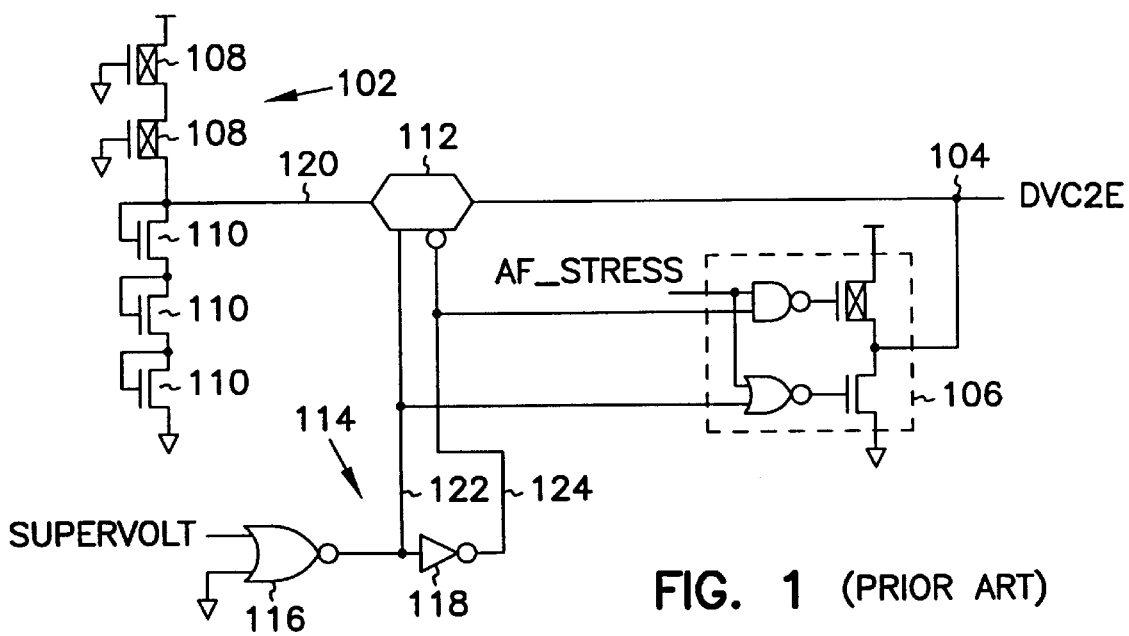
FIG. 1, which is labeled "Prior Art", is a schematic circuit diagram of a known test circuit for use in stress testing of an antifuse prior to programming of the antifuse.

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical and other changes may be made without departing from the scope of the present invention. The following detailed description is, therefore, not to be taken in a limiting sense, and the scope of the present invention is defined only by the appended claims. In the drawings, like numerals describe substantially similar components throughout the several views.

One aspect of the present invention includes a test circuit for stress testing a test element, e.g. a programmable element such as an antifuse. As an example, an antifuse is used in an antifuse bank 530 of an integrated circuit memory device, e.g. for rerouting memory addresses to substitute redundant portions of the memory for defective portions. In FIG. 3, one embodiment of the test circuit according to the invention couples to an output node 304 a voltage DVC2E, in a normal mode of operation, produced by a voltage source such as voltage generating circuit 302. Output node 304 is coupled to the test element, e.g., output node 304 is connected to a terminal 204 of an antifuse detection circuit, such as the antifuse detection circuit shown in FIG. 2, which detects the programmed state of antifuse 202. In a stress test mode of operation, the test circuit decouples voltage generating circuit 302 from output node 304, and couples to output node 304 a stress voltage applied to probe pad 306, for a time duration that can vary from milliseconds to seconds, depending upon the stress voltage level used.

In normal operation, voltage generating circuit 302 provides a normal operating voltage level at output node 304 for the voltage DVC2E. In one embodiment, for example, the power supply voltage is 3.5 volts and the voltage DVC2E at node 304 is a normal operating voltage of 2.1 volts. The test circuit includes a first gating circuit 314, including multiplexer 312 and associated enabling circuit 315 comprised of gates 316 and 318, and a second gating circuit 320, including multiplexer 322. Voltage generating circuit 302 is similar to voltage generating circuit 102 and provides a voltage DVC2E. Enabling circuit 315 controls operation of multiplexer 312 based upon the test enable signal SUPERVOLT that is provided during a test mode of operation.

The output of the voltage generating circuit 302 is coupled to output node 304 through multiplexer 312. Multiplexer 312 is controlled by the enabling circuit 315, which enables multiplexer 312 to pass the voltage DVC2E to output node 304 when test signal SUPERVOLT is not asserted.

Second gating circuit 320 includes multiplexer 322 and associated enabling circuits such as inverter 324. Inverter 324 and the control input of multiplexer 322 receive a stress voltage enable signal AF_STRESS. Inverter 324 provides the complementary state of stress voltage enable signal AF_STRESS, i.e., AF_STRESS*, to the complimentary control input of multiplexer 322. When AF_STRESS is asserted, multiplexer 322 couples probe pad 306 to output node 304. Probe pad 306 receives an externally provided stress voltage of any voltage level suitable for stress test of the test element, such as antifuse 202. In one embodiment, the stress voltage is 3.5 volts.

Figure 2:
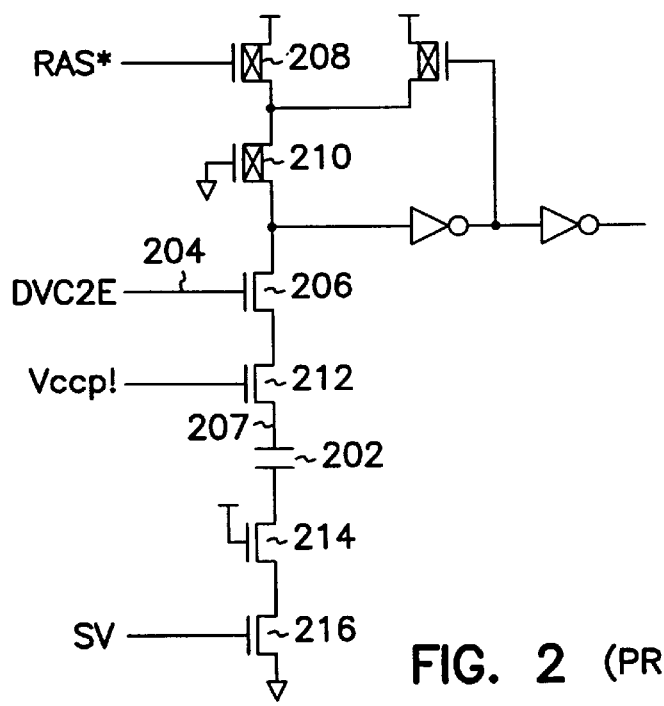
FIG. 2, which is labeled "Prior Art", is a schematic circuit diagram of a known antifuse detection circuit.
Figure 3:
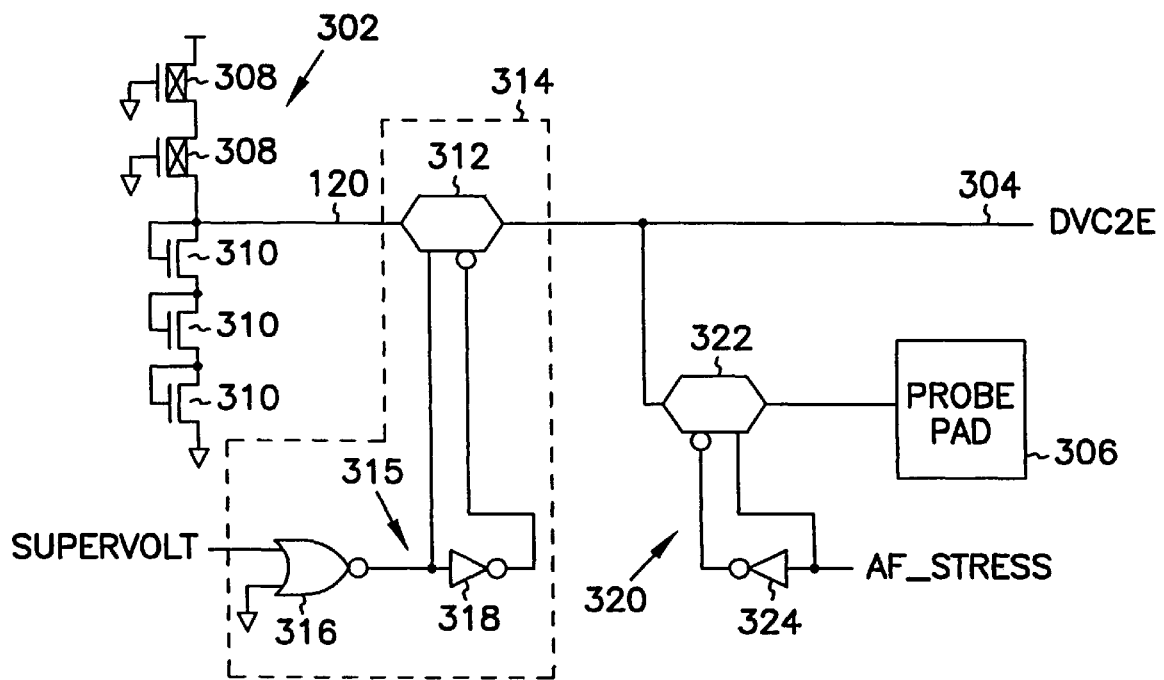
FIG. 3 is a schematic circuit diagram illustrating generally one embodiment of a test circuit provided by the invention for regulating the stress voltage applied to an antifuse during stress testing of an antifuse.

In one embodiment, the voltage at output node 304 is used as a regulating voltage for the antifuse detection circuit of FIG. 2 by controlling a transistor such as the gate terminal at node 204 of pass gate 206. Pass gate 206 will pull the voltage at node 207 up to approximately a threshold voltage, $V_T$, below the voltage at output node 304. This protects antifuse 202 from excessively high stress voltages, i.e. the voltage at node 207 is still maintained between the power supply voltage VCC and ground voltage.

Because the stress voltage is independent of VCC, antifuse stress testing can advantageously be concurrent with other antifuse pre-fuse tests or RAM memory cell tests that require other particular values of the power supply voltage VCC. Thus, in one embodiment the antifuse stress test is effectively "hidden" in a concurrent pre-fuse test; no separate "dedicated" test is required. In one embodiment, for example, there are eleven pre-fuse tests, excluding open, short, leakage, and other non-functionality tests, and the antifuse stress test can be conducted concurrently with any one or more of these tests. For example, the pre-fuse tests include refresh test, high voltage test, low voltage test, and other tests. In this embodiment, each of these eleven tests modes include a supervoltage, allowing the antifuse stress test mode to be latched during any one or all of these normal pre-fuse tests.

The above-described stress test also allows the stress voltage level to be easily adjusted and optimized, such as for different programmable elements, integrated circuit products, and processes, or for any shifts in operating parameters, such as flat nitride dielectric breakdown voltage of the antifuses being tested. The breakdown level for the nitride antifuse dielectrics of antifuses can vary for different production runs. Moreover, different products are produced in different production runs. For such conditions, the use of a fixed stress voltage could result in unwanted damage to the test element. In one embodiment of the invention, if antifuse failures are determined to be the result of over stressing during the stress test, the stress voltage can easily be decreased to a safer level.

Figure 4:
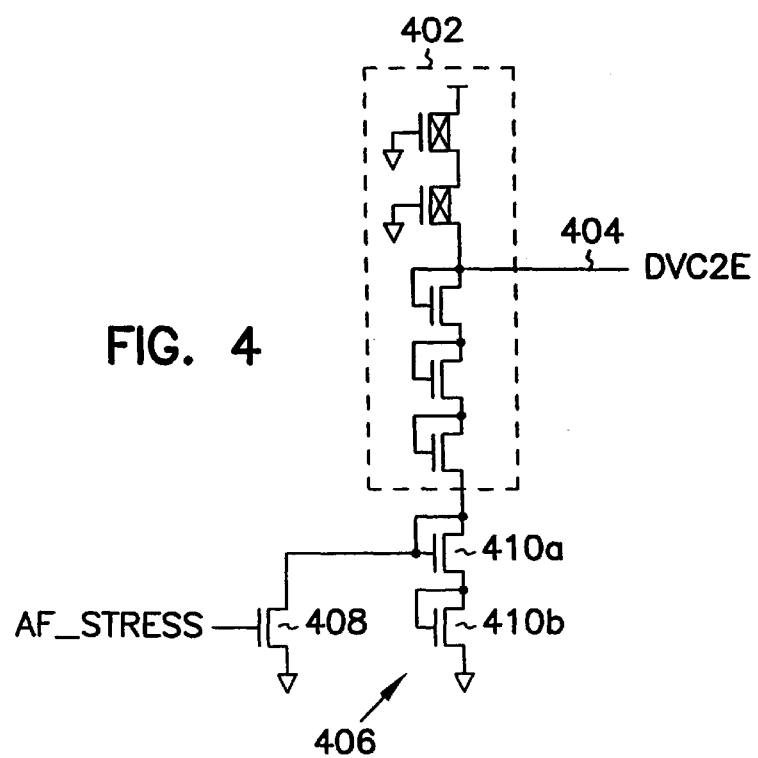
FIG. 4 is a schematic circuit diagram illustrating generally a second embodiment of a test circuit for use for regulating the stress voltage applied to an antifuse during stress testing of an antifuse.

FIG. 4 illustrates a second embodiment of a test circuit for stress testing test elements, including programmable elements such as antifuses. FIG. 4 includes a voltage generating circuit 402 that is similar to the voltage generating circuit 102. However, voltage generating circuit 402 controls the voltage DVC2E at output node 404, which is coupled to node 204 of FIG. 2. During normal operation, a normal operating voltage is provided at output node 404. During a stress test mode of operation, a stress voltage is provided at output node 404. In FIG. 4, the test circuit includes a control circuit, which comprises bias circuit 406 and a shunt circuit 408. The control circuit changes a ground reference voltage of the voltage generating circuit 402, thereby shifting the level of the output voltage at node 404 relative to ground.

In one embodiment, shunt circuit 408 includes an n-channel transistor in parallel with bias circuit 406, which includes a stack of diode-connected n-channel transistors 410a, 410b, interposed between a ground voltage reference of voltage generating circuit 402 and the ground voltage. Thus, the level of the voltage DVC2E at output node 404 is adjustably referenced to the ground voltage.

The gate of the transistor in shunt circuit 408 receives stress voltage enable signal AF_STRESS*, which is at a low logic level during stress testing, and at a high logic level during normal operation. Transistor 408 conducts during normal operation, when AF_STRESS* is at a high logic level, bypassing diode-connected transistors 410. During stress testing, transistor 408 is off, i.e., non-conducting, and the diode-connected transistors 410 are coupled in series with the voltage generating circuit 402. This raises the ground reference voltage level provided to the voltage generating circuit 402, thereby increasing the voltage DVC2E from its normal operating voltage level to its stress voltage level.

According to one aspect of the invention, the test circuit generates an stress voltage DVC2E that is referenced to ground voltage VSS rather than to the power supply voltage VCC. As a result, the stress voltage level does not change with changes in the power supply voltage VCC such as occur during other pre-fuse testing procedures. Therefore antifuse stress testing can be concurrent with other normal pre-fuse testing that requires differing or various levels of power supply voltage VCC. This advantageously reduces test time, and correspondingly reduces manufacturing costs.

Figure 5:
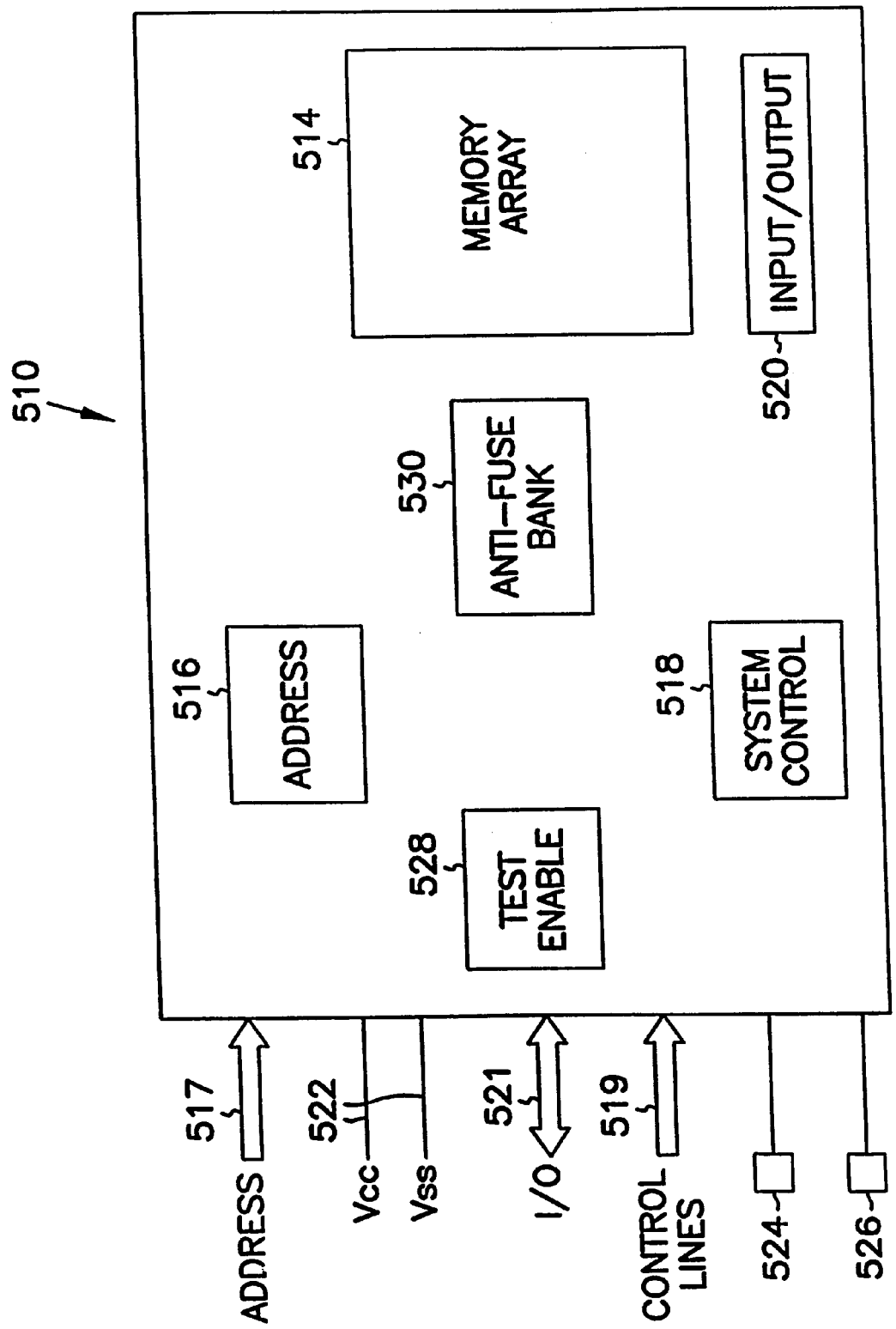
FIG. 5 is a block diagram illustrating generally one embodiment of an integrated circuit memory device incorporating the test circuit provided by the invention.

In FIG. 5, the test circuit provided by the invention is incorporated into an integrated circuit memory device, such as a dynamic random access memory (DRAM) device 510, by way of example and not by limitation. Those skilled in the art will readily recognize that the present invention may be used in a wide variety of devices which incorporate anti-fuses, such as, for example, a static random access memory (SRAM), a synchronous random access memory, a readily memory (ROM), a programmable logic array (PLA), an electrically erasable and programmable read only memory (EEPROM), an application specific integrated circuit (ASIC), or other integrated circuit device. The DRAM device 510 includes an array of memory cells 514 and address circuitry 516 for addressing the memory cells using address data supplied via external address lines 517. The DRAM device 510 further includes memory system control circuitry 518 that is connected with an external microcontroller via external control lines 519, and input/output circuitry 520 that is connected to input/output lines 521 for receiving data to be stored in the memory array and to which data read from the memory array are provided. The DRAM device 510 includes connections to positive power supply voltage VCC, 522, and negative power supply voltage (ground reference voltage) VSS, 523.

The DRAM device 510 includes an antifuse bank 530 having a plurality of programmable elements, such as antifuse 202, which are used to program the DRAM device 510 to provide various application specific functions as is known in the art. For example, a plurality of the antifuses can be contained in an addressable array with the antifuses being selectively programmed to reroute memory addresses for replacing a redundant row of memory cells for a failed row of memory cells in the memory array 514. In one embodiment, the DRAM device 510 further includes a test mode enable circuit 528, which is adapted to respond to coded address signals for enabling the DRAM device 510 to function in a test mode as is known in the art. Alternatively, the DRAM device 510 can be placed in a test mode through the application of a "supervoltage" to an external pad, such as at external pad 524. The "supervoltage" signal is detected by a high voltage detecting circuit, which responsively generates the signal SUPERVOLT to activate the enabling circuit 314. In one embodiment, the DRAM includes a further external pad 526, corresponding to probe pad 306, which is used to input an antifuse stress voltage for the test circuit of FIG. 3.

Thus, the present invention includes an antifuse stress test circuit. The test circuit provides an antifuse stress voltage that is independent of the power supply voltage VCC, allowing antifuse stress testing simultaneous with other pre-fuse tests. Moreover, the magnitude of the stress voltage can be adjusted to compensate for variations in device or process conditions. In one embodiment, the stress test control voltage is applied during probe testing using an external probe pad. In another embodiment, the test circuit controls the DVC2E voltage generating circuit to provide a test voltage that is independent of changes in the supply voltage.

It is to be understood that the above description is intended to be illustrative, and not restrictive. The above description is intended to include sufficient detail to enable those skilled in the art to practice the invention, but it is to be understood that other embodiments may be utilized and that logical and other changes may be made without departing from the scope of the present invention. For example, active high signals can be substituted for active low signals, and logic circuitry added or modified. P-channel and n-channel transistors may be interchanged, and different power supply and ground voltage references may be used. Many other embodiments will be apparent to those of skill in the art upon reviewing the above description. Thus, the scope of the invention is not limited to the particular embodiments shown and described herein.

What is claimed is:

1. A test circuit for providing a first voltage, in a normal mode of operation, and a stress voltage, in an stress test mode of operation, the test circuit including:
    an output node;
    a first gating circuit comprising a first multiplexer, the first gating circuit coupling the first voltage to the output node through the first multiplexer; and
    a second gating circuit comprising a second multiplexer, the second gating circuit coupling the stress voltage to the output node through the second multiplexer.

2. The test circuit of claim 1, in which the output node is coupled to a test element through a transistor.

3. The test circuit of claim 2, wherein a gate terminal of the transistor is coupled to the output node and a source/drain terminal of the transistor is coupled to the test element.

4. The test circuit of claim 1, wherein the stress voltage is applied to an antifuse test element through the control input of a pass gate for regulating the voltage that is applied to the antifuse by an antifuse detection circuit.

5. A test circuit for providing first and stress voltage levels, the test circuit comprising:
    an output node;
    a voltage generating circuit coupled to the output node; and
    a control circuit comprising a bias circuit interposed between the voltage generating circuit and ground, the control circuit adjusting a voltage at the output node from the first voltage level generated by the voltage generating circuit to the stress voltage level.

6. The test circuit of claim 5, wherein the output node is coupled to a test element through a transistor.

7. The test circuit of claim 6, wherein a gate terminal of the transistor is coupled to the output node and a source/drain terminal of the transistor is coupled to the test element.

8. The test circuit of claim 5, wherein the stress voltage is applied to an antifuse test element through the control input of a pass gate for regulating the voltage that is applied to the antifuse by an antifuse detection circuit.

9. The test circuit of claim 5, including a reference shifting circuit for changing a ground reference of the voltage generating circuit, thereby shifting the level of the output voltage relative to ground.

10. The test circuit of claim 9, wherein the reference shifting circuit includes the bias circuit interposed between the voltage generating circuit and ground, and a shunt circuit, in parallel with the bias circuit, for shunting the bias circuit, thereby coupling the voltage generating circuit to ground.

11. The test circuit of claim 10, wherein the shunt and bias circuits increase the output voltage from the operating voltage level to the stress test voltage level in response to a stress voltage enable signal.

12. A semiconductor memory device, comprising:
    a memory array having a plurality of addressable memory cells;
    at least one programmable element; and
    a test circuit for stress testing the element, the test circuit comprising:
        an output node coupled to the element;
        a voltage generating circuit coupled to the output node; and
        a control circuit comprising a bias circuit disposed between the voltage generating circuit and ground, and a shunt circuit in parallel with the bias circuit, the control circuit adjusting an output voltage at the output node between an operating voltage and a stress voltage.

13. The memory device of claim 12, wherein the programmable elements are antifuses.

14. The memory device of claim 12, wherein the memory array is a dynamic random access memory (DRAM) array.

15. The memory device of claim 12, wherein the output node is coupled to the element through a transistor.

16. The test circuit of claim 15, wherein a gate terminal of the transistor is coupled to the output node and a source/drain terminal of the transistor is coupled to the element.

17. The test circuit of claim 12, wherein the stress voltage is applied to an antifuse programmable element through the control input of a pass gate for regulating the voltage that is applied to the antifuse by an antifuse detection circuit.

18. A method for stress testing a test element, the method comprising:

decoupling, from a voltage generating circuit, an output node coupled to the test element;

receiving a stress voltage enable signal by a test circuit; and coupling the output node to a externally provided stress voltage after receiving the stress voltage enable signal.

19. The method of claim 18, including adjusting the stress voltage to regulate, through a control gate of a transistor, the magnitude of a voltage applied to the test element.

20. The method of claim 18, wherein the test element is an antifuse.

21. A method for stress testing a test element, the method comprising:

generating a voltage corresponding to a stress testing signal;

adjusting an output node voltage magnitude from an operating voltage to an externally provided stress voltage; and applying the stress voltage to the test element through a multiplexer coupled to the output node.

22. The method of claim 21, including adjusting the stress voltage to regulate, through a control gate of a transistor, the magnitude of a voltage applied to the test element.

23. The method of claim 21, wherein the test element is an antifuse.

24. A test circuit for providing to a test element an operating voltage and a stress voltage, the test circuit including:

an output node coupled to the test element;

a voltage generating circuit coupled to the output node and adapted to generate the operating voltage;

means for coupling the operating voltage generated by the voltage generating circuit to the output node; and means for coupling the stress voltage generated by an external source to the output node in response to a stress voltage enable signal.

25. An integrated circuit, including:

an output node;

a ground node;

an antifuse between the output node and the ground node;

a transistor, including a gate terminal coupled to the output node and a source/drain terminal coupled to the antifuse;

a voltage source, including a voltage source output;

a first multiplexer for coupling the voltage source output to the output node;

a pad for receiving the stress voltage; and a second multiplexer for coupling the stress voltage received from the pad to the output node.

26. An integrated circuit, including:

an output node;

a ground node;

an antifuse coupled between the output node and the ground node;

a voltage source, including a plurality of series-connected bias voltage generators; and a bypass switch for bypassing at least one of the bias voltage generators.

27. The integrated circuit of claim 26, in which the bypass switch is on during a normal mode of operation and the bypass switch is off during a stress test mode of operation.

28. The integrated circuit of claim 26, further comprising a transistor, the transistor including a gate terminal coupled to the output node and a source/drain terminal coupled to the antifuse.

29. An integrated circuit, including:

an output node;

a ground node;

an antifuse coupled between the output node and the ground node;

a voltage source including a plurality of series-connected bias voltage generators;

a plurality of series-connected diode-connected transistor elements; and a shunt transistor in parallel with at least one diode-connected transistor element for shorting said at least one diode-connected transistor element during a normal mode of operation, the shunt transistor providing an open circuit to said at least one diode-connected transistor element during a stress test mode of operation.

30. A method of stress testing an antifuse, the method comprising:

generating a first voltage using a plurality of series-coupled diode-connected transistors;

generating a second voltage by bypassing at least one of the series-coupled diode-connected transistors;

providing the first voltage to an antifuse during a stress test mode of operation; and providing the second voltage to the antifuse during a normal mode of operation.

\* \* \* \* \*